US008259955B2

(12) United States Patent
Su et al.

(10) Patent No.: US 8,259,955 B2
(45) **Date of Patent: *Sep. 4, 2012**

(54) FAN NOISE CANCELING SYSTEM

(75) Inventors: Fu-Cheng Su, Sinjhauang (TW); Yuan-Liang Liao, Sinjhauang (TW); Jyh-Ren Lee, Sinjhuang (TW); Yi-Hong Liao, Sinjhuang (TW)

(73) Assignee: Asia Vital Components Co., Ltd., Taipei County (TW)

( * ) Notice: Subject to any disclaimer, the term of this patent is extended or adjusted under 35 U.S.C. 154(b) by 919 days.

This patent is subject to a terminal disclaimer.

(21) Appl. No.: 12/148,721

(22) Filed: Apr. 22, 2008

(65) Prior Publication Data

US 2009/0180637 A1 Jul. 16, 2009

(30) Foreign Application Priority Data

Jan. 15, 2008 (TW) ................................ 97101437 A

(51) Int. Cl.
*H03B 29/00* (2006.01)

(52) U.S. Cl. .................................................... 381/71.12

(58) Field of Classification Search ................. 381/71.1, 381/71.12, 71.2, 71.5, 71.7, 71.13, 73.1, 381/71.3; 181/206

See application file for complete search history.

(56) References Cited

U.S. PATENT DOCUMENTS

| | | | | |
|---|---|---|---|---|
| 5,010,576 | A * | 4/1991 | Hill | 381/71.9 |
| 5,393,199 | A | 2/1995 | Alizadeh | 416/189 |
| 6,244,817 | B1 | 6/2001 | Ngo | 415/119 |
| 6,726,445 | B2 | 4/2004 | Tsuchiya et al. | 415/119 |
| 6,896,095 | B2 | 5/2005 | Shah et al. | 181/198 |
| 7,330,244 | B2 | 2/2008 | Davis et al. | 356/72 |
| 7,334,998 | B2 | 2/2008 | Jones et al. | 416/227 R |

* cited by examiner

*Primary Examiner* — Robert Pascal
*Assistant Examiner* — Khiem Nguyen

(57) ABSTRACT

In a fan noise canceling system, a feedforward signal generated when a fan speed change occurs and a feedback signal read by a sensor are sent to a signal amplifying unit for signal amplification, and the amplified signals are then sent to a signal converting unit for converting into a digital signal. A hybrid controller receives and corrects the digital signals sent thereto, and conducts rapid convergence algorithm to derive a reverse digital signal. The reverse digital signal is sent back to the signal converting unit for converting into a reverse analog signal, which is then sent to the signal amplifying unit for power amplification and generating a control signal to drive a loudspeaker to produce a reverse acoustic wave, which cancels out wave of fan noise to effectively reduce fan noise without adversely affecting the heat dissipation effect of the fan.

5 Claims, 2 Drawing Sheets

FAN NOISE CANCELING SYSTEM

FIELD OF THE INVENTION

The present invention relates to a noise canceling system, and more particularly to a fan noise canceling system.

BACKGROUND OF THE INVENTION

With the rapidly developed information technology, various types of electronic products, such as computers, have become very important and indispensable tools in people's daily life and work. Generally, to upgrade the computer operating performance, electronic components working inside the computer, such as the central processing unit, would consume higher power. As a result, higher thermal effect on the electronic components is produced, and the work curve of the computer tends to shift when the internal temperature of the computer gets higher and higher to thereby cause unstable operation of the internal electronic components. Under this condition, the computer tends to have faulty operation or even become down. In a worse situation, the internal electronic components of the computer will be burned out due to the high internal temperature of the computer. Therefore, it is not difficult to understand why the computer heat dissipation is always a problem deeply confusing the information industry. Now, the use of a cooling fan to carry away the heat produced by the electronic components inside the computer has become a prerequisite part of the computer configuration. While the fan carries away the heat from the computer for the computer to operate stably, the fan also produces noise during the operation thereof to bring another confusing problem.

The problem of fan noise has received high attention of the information and electronic industries, because noise tends to cause different degrees of discomfort and anxiety to people, make people feel tired easily to reduce work efficiency and suffer from mental and physiological detriment. Therefore, effective noise elimination is not only meaningful in terms of technical research fields, but also practical in terms of industrial production and daily life improvement.

Currently, the ways for suppressing fan noise can be divided into two types, namely, passive noise suppression and active noise control (ANC). In the active noise control, a secondary sound source is utilized to interfere and destruct the noise source and thereby achieve the purpose of noise control. The active noise control necessitates the use of a personal computer to effectuate the control and therefore requires relatively high cost. On the other hand, the passive noise suppression refers to the reduction of noise level through improvement made to fan components, such as design changes in the shape of fan frame, the shape of fan blades, the stationary blades, and the ribs. However, when it is desired to make these design changes while maintaining the heat dissipation effect, the fan would usually produce an even higher noise value. Moreover, the passive noise suppression has only limited effect in attenuating low-frequency noise.

In brief, the conventional passive noise suppression and active noise control have the following disadvantages:

1. Changing the design sizes of or the material for making different fan components according to the passive noise suppression would increase the cost of fan and has little effect in terms of low-frequency noise.
2. Mounting additional passive blades or frames for the purpose of reducing fan noise would result in early occurrence of resonant frequency produced by the fan, which will in turn cause reduced usable life of the fan and damage the electronic components inside the computer.

3. The active noise control necessitates the use of a personal computer to effectuate the control and requires increased unit cost, and is therefore not economical for use.

It is therefore desirable to overcome the problems and disadvantages in the conventional passive noise suppression and active noise control.

SUMMARY OF THE INVENTION

A primary object of the present invention is to provide a fan noise canceling system, with which a feedforward signal generated when a fan speed change occurs and a feedback signal read by a sensor are sent to a signal amplifying unit for signal amplification, and the amplified signals are then sent to a signal converting unit for converting into a digital signal. The digital signal is sent to a hybrid controller, and the hybrid controller corrects the received digital signal and conducts rapid convergence algorithm to derive a reverse digital signal. The reverse digital signal is sent back to the signal converting unit for converting into a reverse analog signal, which is then sent to the signal amplifying unit for power amplification to generate a control signal, so that a loudspeaker is driven by the control signal to produce a reverse acoustic wave, which cancels out the wave of fan noise to effectively reduce the fan noise without adversely affecting the heat dissipation effect of the fan.

In the present invention, the signal amplifying unit consists of a pre-amplifier and a power amplifier. The feedforward signal generated when the fan speed changes and the feedback signal detected by the sensor are sent to the pre-amplifier for signal amplification and then to the signal converting unit for converting into a digital signal. And, when the reverse digital signal derived from the rapid convergence algorithm conducted by the hybrid controller is converted by the signal converting unit into the reverse analog signal, the reverse analog signal is sent to the power amplifier for power amplification to generate the control signal. So that the loudspeaker is driven by the control signal to produce an acoustic wave that has a volume the same as the noise source and a phase reverse to that of the noise source, so as to reduce the wide-frequency noise produced by the fan and to improve the heat dissipation effect of the fan.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

A fan noise canceling system according to a preferred embodiment of the present invention is a stand alone system, which employs active noise control (ANC) to process low-frequency fan noise without the need of being aided with a personal computer, and is therefore cost-effective.

Figure 1:
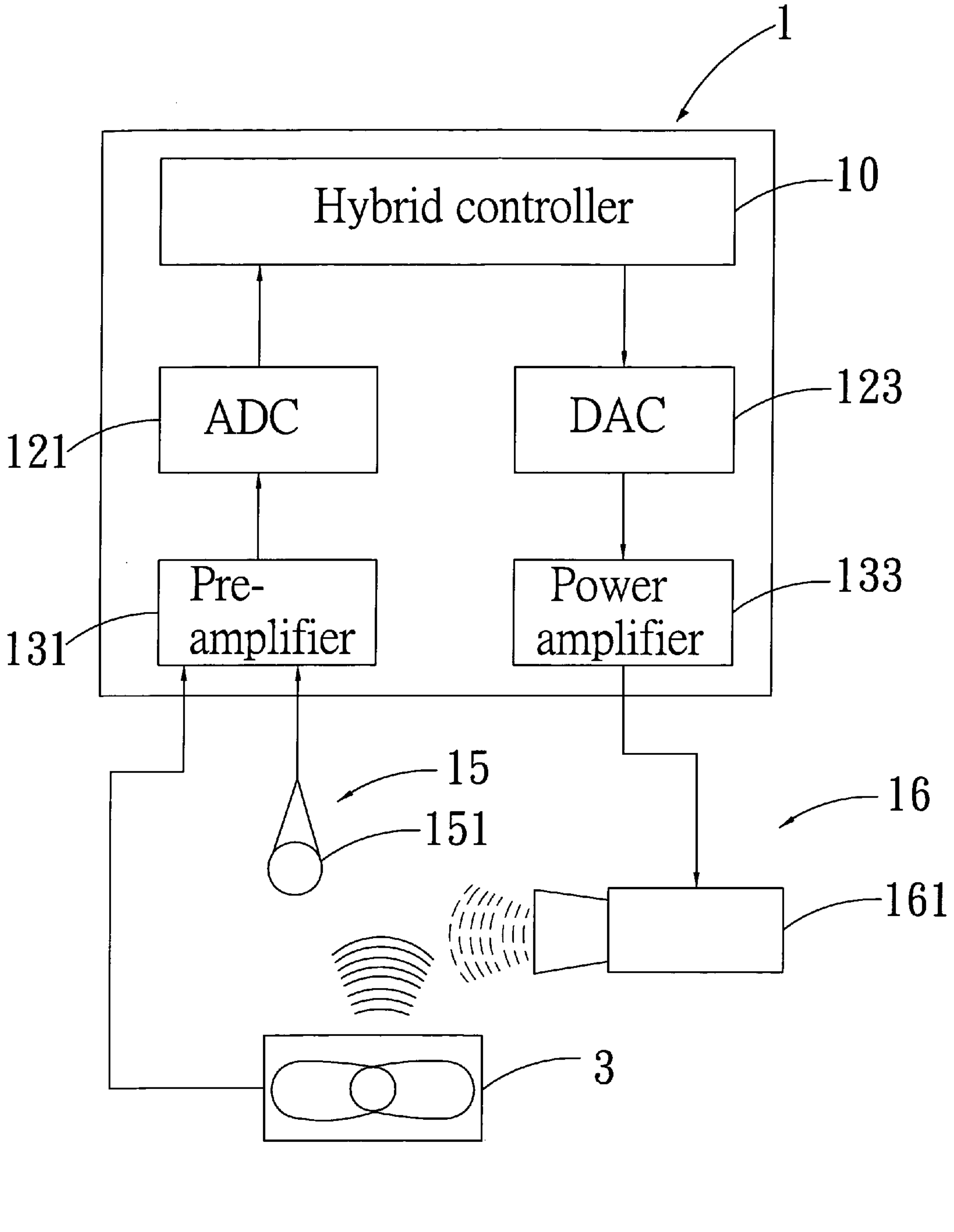
FIG. 1 is a block diagram of a hybrid controller for the fan noise canceling system of the present invention.
Figure 2:
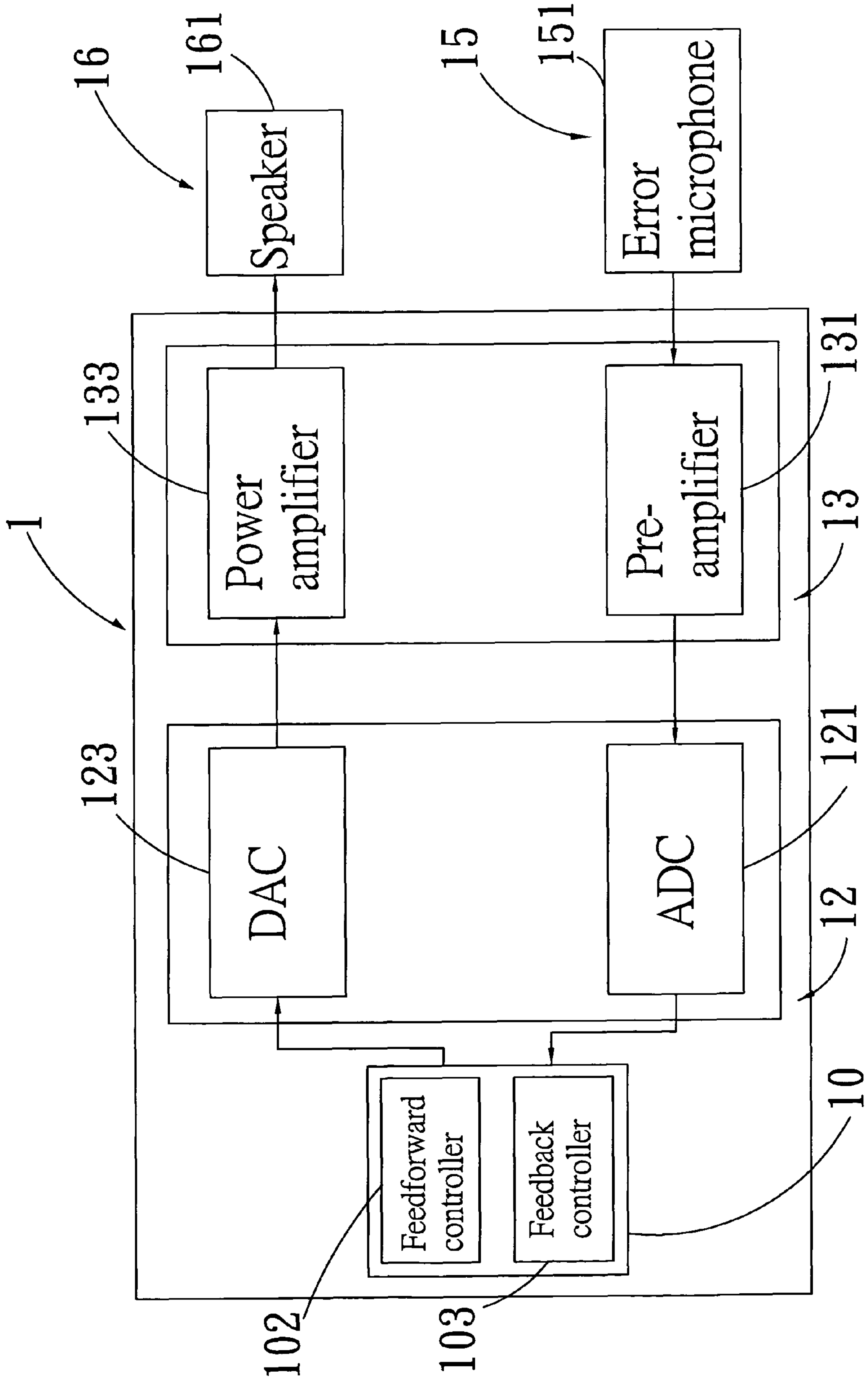
FIG. 2 is a block diagram of the fan noise canceling system according to the present invention.

Please refer to FIGS. 1 and 2. The fan noise canceling system of the present invention includes a digital signal microprocessor 1, a sensor 15, and a loudspeaker 16. The sensor 15 may be an error microphone 151 for detecting a feedback signal that feeds back an error, and the loudspeaker 16 may be a speaker 161.

The digital signal microprocessor 1 includes a hybrid controller 10, a signal converting unit 12, and a signal amplifying unit 13. The signal amplifying unit 13 amplifies a feedforward signal that is generated when a fan 3 connected to the noise canceling system has a change in speed, and the feedback signal detected by the error microphone 151. The amplified signals are then sent to the signal converting unit 12, at where the signals are converted into a digital signal. The hybrid controller 10 corrects the digital signal received from the signal converting unit 12, and conducts rapid convergence algorithm to generate a reverse digital signal, which is then sent back to the signal converting unit 12. The signal converting unit 12 converts the received reverse digital signal into a reverse analog signal, which is then sent to the signal amplifying unit 13 for power amplification to thereby generate a control signal. The speaker 161 receives the control signal and produces a reverse acoustic wave according to the received control signal, so as to cancel out wave of the noise produced by the fan 3 and thereby suppress the noise without adversely affecting the heat dissipating effect of the fan or increasing any cost.

The signal amplifying unit 13 consists of a pre-amplifier 131 and a second or power amplifier 133. The pre-amplifier 131 amplifies a received signal, and is electrically connected to the error microphone 151 and the fan 3. The power amplifier 133 is electrically connected to the speaker 161 for enhancing signal power.

The signal converting unit 12 consists of an analog to digital converter (ADC) 121 and a digital to analog converter (DAC) 123. The ADC 121 converts a received analog signal into a digital signal, and is electrically connected to the pre-amplifier 131 and the hybrid controller 10; and the DAC 123 converts a received reverse digital signal into a reverse analog signal, and is electrically connected to the power amplifier 133 and the hybrid controller 10.

In the preferred embodiment of the present invention, the hybrid controller 10 consists of a feedforward controller 102 and a feedback controller 103. The feedforward controller 102 is characterized by its good performance and stability, and the feedback controller 103 is characterized by its rapid convergence algorithm ability. When the fan 3 operates, a feedforward signal generated according to a speed change of the fan 3 is sent to the pre-amplifier 131. Meanwhile, a feedback signal feeding back an error is detected by the error microphone 151 and sent to the pre-amplifier 131. The pre-amplifier 131 amplifies the feedback signal and the feedforward signal, and sends the amplified signals to the ADC 121. The ADC 121 converts the received signals into a digital signal, which is then sent to the hybrid controller 10. Then, the hybrid controller 10 reads and corrects the received digital signals, and conducts rapid convergence algorithm to derive a reverse digital signal, which is sent to and received by the DAC 123 to be converted into a reverse analog signal. The reverse analog signal is sent to the power amplifier 133 for power amplification to generate a control signal for driving the speaker 161 to produce a reverse acoustic wave. Therefore, the wave of noise produced by the fan 3 is cancelled out by the reverse acoustic wave produced by the speaker 161 to achieve the purpose of canceling wide-frequency noise and enhancing heat dissipation.

The present invention has been described with a preferred embodiment thereof and it is understood that many changes and modifications in the described embodiment can be carried out without departing from the scope and the spirit of the invention that is intended to be limited only by the appended claims.

What is claimed is:

1. A fan noise canceling system, consisting of a loudspeaker, a sensor, and a digital signal microprocessor; the digital signal microprocessor including:

a signal amplifying unit consisting of a pre-amplifier and a power amplifier; the pre-amplifier being electrically connected to the sensor and a fan, and the power amplifier being electrically connected to the loudspeaker;

a signal converting unit consisting of an analog to digital converter (ADC) and a digital to analog converter (DAC); the ADC being electrically connected to the pre-amplifier, and the DAC being electrically connected to the power amplifier; and a hybrid controller being electrically connected to the ADC and the DAC;

whereby when the fan operates and a feedforward signal is generated due to a speed change of the fan, and the sensor detects a feedback signal that feeds back an error, the feedforward signal and the feedback signal are sent to the pre-amplifier for signal amplification; the amplified signals are then sent to the ADC for converting into a digital signal; the hybrid controller receives and corrects the digital signals, and conducts rapid convergence algorithm to derive a reverse digital signal, which is then sent to the DAC for converting into a reverse analog signal; and the reverse analog signal is sent to the power amplifier for power amplification to generate a control signal, so that the loudspeaker is driven by the control signal to produce a reverse acoustic wave for canceling out noise produced by the fan to thereby achieve the purpose of canceling wide-frequency noise.

2. The fan noise canceling system as claimed in claim 1, wherein the hybrid controller consists of a feedforward controller and a feedback controller.

3. The fan noise canceling system as claimed in claim 1, wherein the sensor is an error microphone.

4. The fan noise canceling system as claimed in claim 1, wherein the loudspeaker is a speaker.

5. The fan noise canceling system as claimed in claim 1, wherein the system is a standalone system.

* * * * *